US012727176B2

(12) United States Patent
Hu

(10) Patent No.: US 12,727,176 B2
(45) Date of Patent: Sep. 1, 2026

(54) THREE-DIMENSIONAL MEMORY DEVICES AND MANUFACTURING METHODS THEREOF AND THREE-DIMENSIONAL MEMORIES

(71) Applicant: Yangtze Memory Technologies Co., Ltd., Wuhan (CN)

(72) Inventor: SiPing Hu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 430 days.

(21) Appl. No.: 18/463,900

(22) Filed: Sep. 8, 2023

(65) Prior Publication Data

US 2023/0422528 A1 Dec. 28, 2023

Related U.S. Application Data

(63) Continuation of application No. PCT/CN2022/082306, filed on Mar. 22, 2022.

(30) Foreign Application Priority Data

Mar. 27, 2021 (CN) ......................... 202110330026.2

(51) Int. Cl.
*H01L 25/18* (2023.01)
*H10B 80/00* (2023.01)
(Continued)

(52) U.S. Cl.
CPC ............ *H10B 80/00* (2023.02); *H10W 90/00* (2026.01); *H10W 80/211* (2026.01);
(Continued)

(58) Field of Classification Search
CPC ........ H10B 80/00; H10B 43/27; H10W 90/00
See application file for complete search history.

(56) References Cited

U.S. PATENT DOCUMENTS 10,600,781 B1 3/2020 Xiao
10,636,813 B1 4/2020 Xiao
(Continued)

FOREIGN PATENT DOCUMENTS

CN 108573959 A 9/2018
CN 109075170 A 12/2018
(Continued)

OTHER PUBLICATIONS

Korean Intellectual Property Office, "Request for the Submission of an Opinion," issued in connection with Korean Patent Application No. 2023-7023075, dated Jul. 19, 2024, 25 pages. [English Translation Included].

(Continued)

*Primary Examiner* — Thao P Le
(74) *Attorney, Agent, or Firm* — Hanley, Flight & Zimmerman, LLC

(57) ABSTRACT

The present disclosure provides a three-dimensional memory device and a manufacturing method thereof, and a three-dimensional memory. The three-dimensional memory device includes a first memory cell and at least one second memory cell sequentially stacked on the first memory cell. Each memory cell includes a first set of contacts, and a memory array device and a CMOS device that are stacked and electrically connected with each other, and the first set of contacts is disposed on a side of the memory array device facing away from the CMOS device and electrically connected with the CMOS device. The second memory cell further comprises a second set of contacts that is disposed on a side of the CMOS device facing away from the memory array device and electrically connected with the CMOS device. The memory array device of the first memory cell is bonded with the CMOS device of the adjacent second memory cell, and the first set of contacts of the first memory (Continued)

cell is correspondingly electrically connected with the second set of contacts of the adjacent second memory cell.

8 Claims, 9 Drawing Sheets

(51) Int. Cl.
*H10W 90/00* (2026.01)
*H10W 80/00* (2026.01)

(52) U.S. Cl.
CPC ........ *H10W 80/312* (2026.01); *H10W 80/327* (2026.01); *H10W 90/792* (2026.01)

(56) References Cited

U.S. PATENT DOCUMENTS

| | | | | |
|---|---|---|---|---|
| 11,322,483 | B1 * | 5/2022 | Ogawa | H10W 90/00 |
| 11,631,690 | B2 * | 4/2023 | Okina | H10B 43/50 257/314 |
| 11,784,794 | B2 * | 10/2023 | McElheny | H04L 9/065 365/51 |
| 12,381,183 | B2 * | 8/2025 | Koyanagi | H10W 90/00 |
| 2016/0005744 | A1 | 1/2016 | Someya | |
| 2018/0261575 | A1 | 9/2018 | Tagami | |
| 2019/0043836 | A1 | 2/2019 | Fastow et al. | |
| 2019/0189632 | A1 | 6/2019 | Lee | |
| 2019/0363129 | A1 | 11/2019 | Yokoyama et al. | |
| 2020/0098776 | A1 | 3/2020 | Sugisaki | |
| 2020/0105721 | A1 | 4/2020 | Park | |
| 2020/0227397 | A1 | 7/2020 | Yada | |
| 2020/0295043 | A1 | 9/2020 | Nishida et al. | |
| 2020/0328186 | A1 | 10/2020 | Liu | |
| 2020/0395328 | A1 * | 12/2020 | Fastow | G11C 5/025 |
| 2021/0083005 | A1 * | 3/2021 | Bateman | H10B 63/22 |
| 2022/0028846 | A1 * | 1/2022 | Alsmeier | H10W 90/00 |
| 2022/0199641 | A1 * | 6/2022 | Fukuzumi | H10B 41/10 |
| 2022/0293198 | A1 * | 9/2022 | Sakakibara | G11C 16/24 |
| 2023/0422528 | A1 | 12/2023 | Hu | |

FOREIGN PATENT DOCUMENTS

| | | | |
|---|---|---|---|
| CN | 109148459 | A | 1/2019 |
| CN | 109300903 | A | 2/2019 |
| CN | 109417075 | A | 3/2019 |
| CN | 110010612 | A | 7/2019 |
| CN | 110620117 | A | 12/2019 |
| CN | 110914991 | A | 3/2020 |
| CN | 111211126 | A | 5/2020 |
| CN | 112510031 | A | 3/2021 |
| CN | 112802855 | A | 5/2021 |
| JP | 2014165191 | A | 9/2014 |
| JP | 2020047814 | A | 3/2020 |
| JP | 2022521618 | A | 4/2022 |
| KR | 20190142715 | A | 12/2019 |
| KR | 20200037895 | A | 4/2020 |
| KR | 20210000753 | A | 1/2021 |
| WO | 2018135194 | A1 | 7/2018 |
| WO | 2020124877 | A1 | 6/2020 |

OTHER PUBLICATIONS

Japan Patent Office, "Search Report by Registered Search Organization," issued in connection with Japanese Patent Application No. 2023-546108, dated Jul. 31, 2024, 50 pages. [English Translation Included].

Japan Patent Office, "Notice of Reasons for Refusal," issued in connection with Japanese Patent Application No. 2023-546108, dated Aug. 5, 2024, 15 pages. [English Translation Included].

European Patent Office, "Communication pursuant to Article 94(3) EPC," issued in connection with European Patent Application No. 22 778 678.7-1211, mailed on Jun. 11, 2025, 5 pages.

European Patent Office, "Extended European Search Report," issued in connection with European Patent Application No. 22778678.7, dated Sep. 10, 2024, 12 pages.

Korean Intellectual Property Office, "Written Opinion," issued in connection with Korean Patent Application No. 20237023075, dated Sep. 19, 2024, 20 pages. [English Translation Included].

International Searching Authority, "International Search Report," issued in connection with International Patent Application No. PCT/CN2022/082306, mailed on May 25, 2022, 9 pages. [English Translation Included].

International Searching Authority, "Written Opinion of the International Searching Authority," issued in connection with International Patent Application No. PCT/CN2022/082306, mailed on May 25, 2022, 9 pages. [English Translation Included].

China National Intellectual Property Administration, "First Search," issued in connection with Chinese Patent Application No. 202110330026.2, dated Jul. 5, 2022, 1 page.

China National Intellectual Property Administration, "First Office Action," issued in connection with Chinese Patent Application No. 202110330026.2, dated Jul. 5, 2022, 15 pages. [English Translation Included].

China National Intellectual Property Administration, "Notification to Grant Patent Right for Invention," issued in connection with Chinese Patent Application No. 202110330026.2, dated Feb. 27, 2023, 3 pages. [English Translation Included].

International Searching Authority, "International Preliminary Report on Patentability,"with International Patent Application No. PCT/CN2022/082306, issued on Oct. 3, 2023, 11 pages. [English Translation Included].

Korean Intellectual Property Office, "Written Decision on Registration," issued in connection with Korean Patent Application No. 10-2023-7023075, mailed on Dec. 6, 2024, 5 pages. [English language machine translation included.].

Japanese Patent Office, "Decision of Refusal," issued in connection with Japanese Patent Application No. 2023-546108, mailed on Jan. 28, 2025, 14 pages. [English language machine translation included.].

Japanese Patent Office, "Notice of Reasons for Refusal," issued in connection with Japanese Patent Application No. 2025-075598, dated May 26, 2026, 10 pages. [English machine translation included.].

* cited by examiner

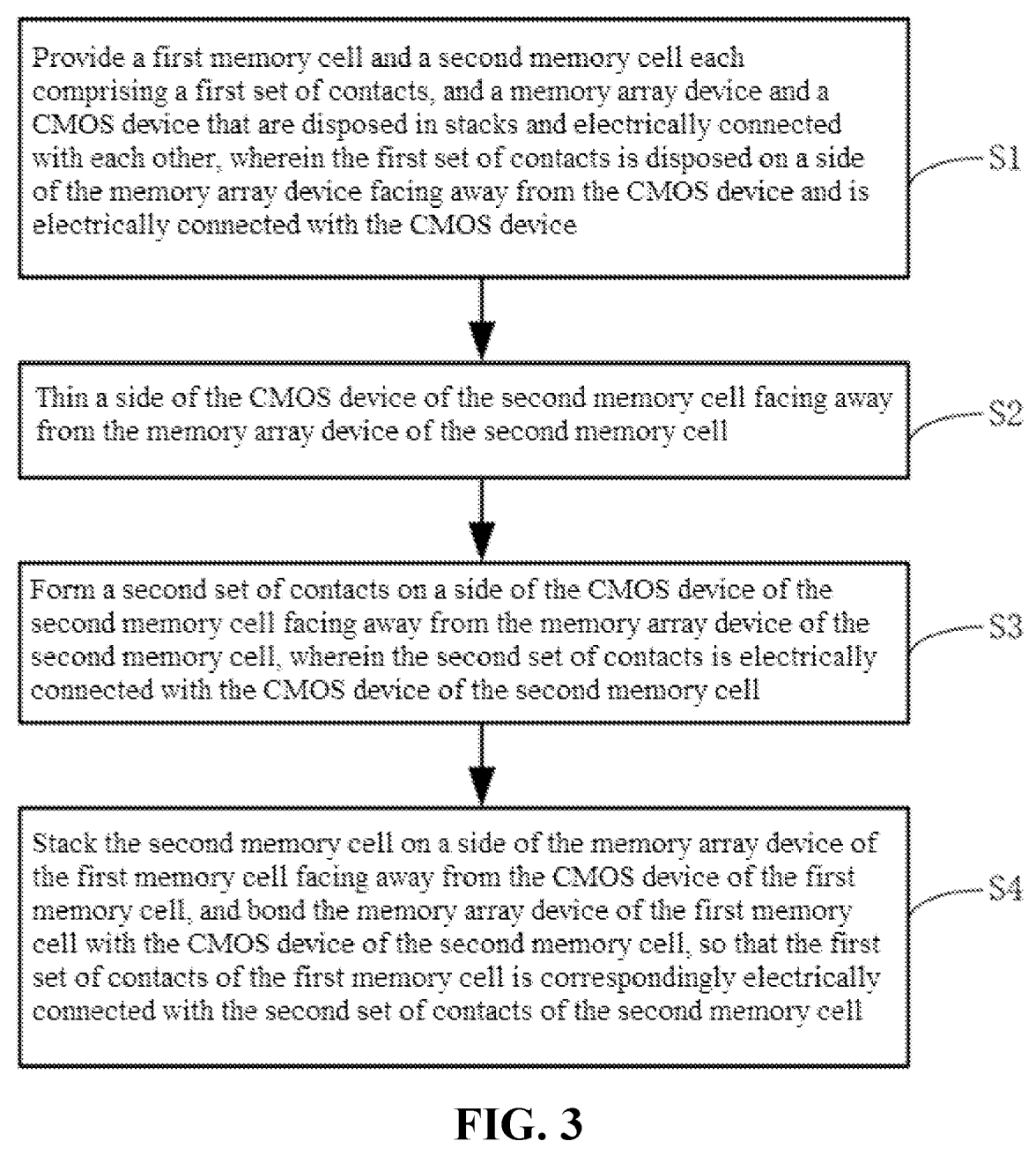

Provide a first memory cell and a second memory cell each comprising a first set of contacts, and a memory array device and a CMOS device that are disposed in stacks and electrically connected with each other, wherein the first set of contacts is disposed on a side of the memory array device facing away from the CMOS device and is electrically connected with the CMOS device — S1

Thin a side of the CMOS device of the second memory cell facing away from the memory array device of the second memory cell — S2

Form a second set of contacts on a side of the CMOS device of the second memory cell facing away from the memory array device of the second memory cell, wherein the second set of contacts is electrically connected with the CMOS device of the second memory cell — S3

Stack the second memory cell on a side of the memory array device of the first memory cell facing away from the CMOS device of the first memory cell, and bond the memory array device of the first memory cell with the CMOS device of the second memory cell, so that the first set of contacts of the first memory cell is correspondingly electrically connected with the second set of contacts of the second memory cell — S4

FIG. 3

THREE-DIMENSIONAL MEMORY DEVICES AND MANUFACTURING METHODS THEREOF AND THREE-DIMENSIONAL MEMORIES

CROSS-REFERENCE TO RELATED APPLICATIONS

The present patent arises from a U.S. patent application that is a continuation of and claims the benefit of International Application No. PCT/CN2022/082306, filed on Mar. 22, 2022, which claims priority to China Patent Application No. 202110330026.2, titled "THREE-DIMENSIONAL MEMORY DEVICE AND MANUFACTURING METHOD THEREOF AND THREE-DIMENSIONAL MEMORY" filed on Mar. 27, 2021, and claims priority to this China Patent Application. Both International Application No. PCT/CN2022/082306 and China Patent Application No. 202110330026.2 are incorporated by reference herein in their entireties.

TECHNICAL FIELD

The present disclosure relates to semiconductor devices, and particularly to a three-dimensional memory devices and a manufacturing methods thereof, and three-dimensional memories including the three-dimensional memory devices.

BACKGROUND

A 3D NAND memory is an emerging type of three-dimensional memory, and addresses the problem that a 2D or planar NAND memory has a limited storage capacity by vertically stacking multiple data memory layers in a memory chip. The memory chip includes a CMOS device and a memory array device with a step structure. The CMOS device and the memory array device are formed on a substrate separately, and the sides of the CMOS device and the memory array device far away from each substrate are electrically connected with each other.

With increasing growth of high-density design demands on the 3D NAND memory, the memory layers in the memory array device of the memory chip are increasing day by day. However, with the increase of the number of stack layers of the memory layers, both the number of step layers and the footprint of the step structure of the memory array device are increased such that the substrate area of the memory array device is increased, which therefore results in the area mismatch between the substrate of the memory array device and the substrate of the CMOS device and causes idle utilization space of the memory chip, thereby being unfavorable to development and volume miniaturization of a next generation 3D NAND memory.

BRIEF DESCRIPTION OF THE DRAWINGS

FIG. 3 is a flow diagram of a manufacturing method of a three-dimensional memory device provided by the present disclosure.

FIGS. 4 to 7 are schematic diagrams of a formation process of a memory cell of a three-dimensional memory device, wherein FIG. 4 is a sectional schematic diagram of a memory array device and a CMOS device;

FIG. 5 is a sectional schematic diagram of a memory array device and a CMOS device as shown in FIG. 4 after being bonded;

FIG. 6 is a sectional schematic diagram of a memory array device and a CMOS device as shown in FIG. 5 after an array substrate is thinned;

FIG. 7 is a sectional schematic diagram after forming a first set of contacts on a side of a memory array device as shown in FIG. 6 facing away from a CMOS device and being covered with a first bonding layer.

Illustration of symbols of example elements found in the description:

| | |
|---|---|
| First memory cell | 100 |
| Second memory cell | 200 |
| Memory array device | 10 |
| Array substrate | 11 |
| Memory layer | 13 |
| CMOS device | 20 |
| CMOS substrate | 21 |
| Interconnection channel | 30 |
| First interconnection sub-channel | 31 |
| Second interconnection sub-channel | 32 |
| Interconnection structure | 33 |
| First interconnection contact | 331 |
| Second interconnection contact | 332 |
| First set of contacts | 40 |
| First conductive channel | 41 |
| First bonding layer | 42 |
| Second set of contacts | 50 |
| Second bonding layer | 52 |
| Isolation layer | 300 |
| Array pad | 400 |
| Protective layer | 500 |
| Second conductive channel | 60 |

The Detailed Description below will further illustrate the present disclosure in conjunction with the above-mentioned drawings.

DETAILED DESCRIPTION

The technical solutions in examples of the present disclosure will be described below clearly and completely in conjunction with the drawings in the examples of the present disclosure. The examples described are only part of, but not all of, the examples of the present disclosure. All other examples obtained by those of ordinary skill in the art based on the examples in the present disclosure without creative work shall fall in the scope of protection of the present disclosure.

In the description of the present disclosure, it is to be noted that the terms “upper”, “lower”, “inner side”, “outer side”, etc. indicate orientations or position relationships that are based on the orientations or position relationships as shown in the figures, which are only intended to facilitate description of the present disclosure and to simplify the description, instead of indicating or implying that the device or element indicated must have a specific orientation and be configured and operated in a specific orientation, and thus cannot be understood as limiting the present disclosure. Furthermore, the terms “first”, “second”, etc. are only for the purpose of description, and cannot be construed as indicating or implying relative importance.

Figure 1:
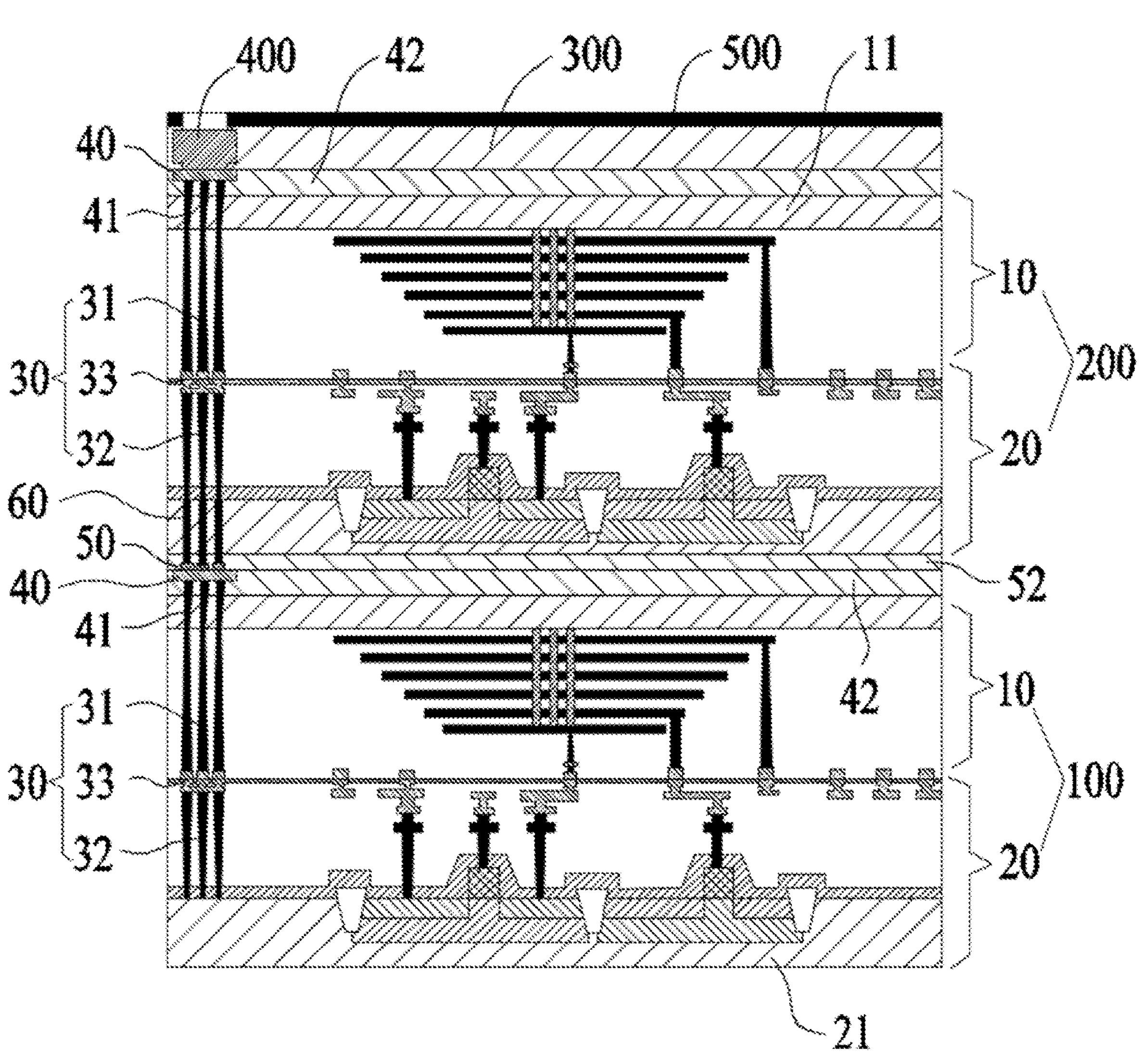
FIG. 1 is a sectional schematic diagram of a three-dimensional memory device provided by one of the examples of the present disclosure.
Figure 2:
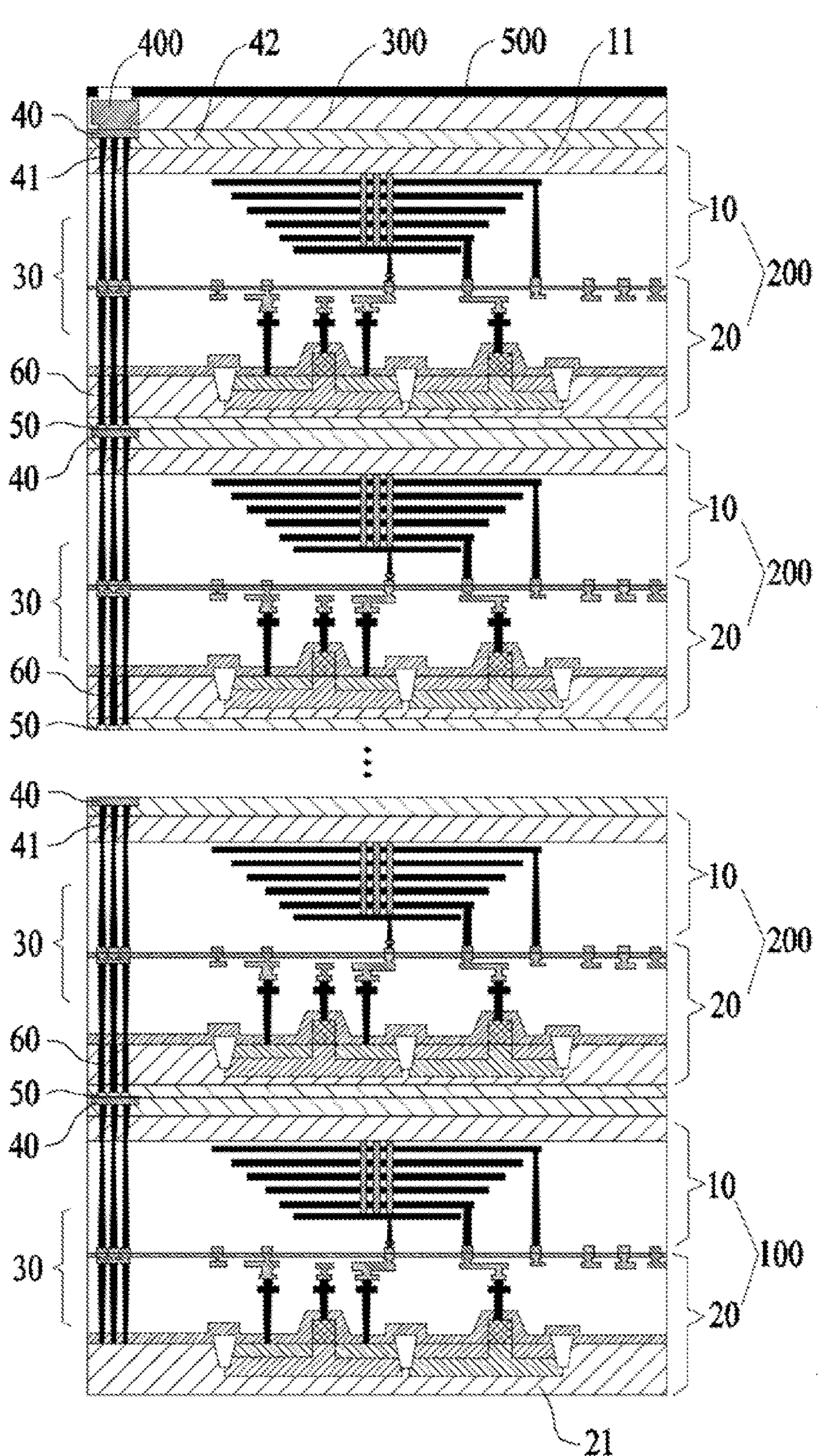
FIG. 2 is a sectional schematic diagram of a three-dimensional memory device provided by another example of the present disclosure.

Referring to FIGS. 1 and 2, the present disclosure provides a three-dimensional memory device which comprises at least two memory cells that are stacked sequentially, where the at least two memory cells comprise a first memory cell 100 and at least one second memory cell 200 stacked on the first memory cell 100. As shown in FIG. 1, in one of the examples of the present disclosure, the number of the second memory cells 200 is one, and the first memory cell 100 and one second memory cell 200 are stacked to constitute a three-dimensional memory device 1000; as shown in FIG. 2, in another example of the present disclosure, the number of the second memory cells 200 is multiple (two or more), the multiple second memory cells 200 are sequentially stacked on the first memory cell 100, and the first memory cell 100 and the multiple second memory cells 200 are stacked to constitute a three-dimensional memory device 1000*b*. The three-dimensional memory device provided by the present disclosure is formed by stacking at least two memory cells, and thus has a high storage density.

As shown in FIGS. 1 and 2, in some examples of the present disclosure, each memory cell comprises a memory array device 10 and a CMOS device 20 that are stacked and electrically connected with each other, and a first set of contacts 40 disposed on a side of the memory array device 10 facing away from the CMOS device 20 and electrically connected with the CMOS device 20. In some examples of the present disclosure, the memory array device 10 and the CMOS device 20 of each memory cell may be connected by bonding to achieve electrical connection therebetween. Of course, in other examples, the memory array device 10 and the CMOS device 20 of each memory cell may also achieve electrical connection by other means, including, but not limited to, wire connection, conductive contact connection, plug-in connection, etc.

The memory array device 10 comprises an array substrate 11 and a memory array disposed on a side of the array substrate 11 close to the CMOS device 20, where the memory array has a data storage function, and comprises several memory layers 13 and several memory strings penetrating through and connecting together the several memory layers 13. The first set of contacts 40 of each memory cell is disposed on a side of the array substrate 11 facing away from the CMOS device 20. The CMOS device 20 comprises a CMOS substrate 21 and a CMOS circuit disposed on a side of the CMOS substrate 21 close to the memory array device 10, where the CMOS circuit is used to achieve logic control, read of stored data, and the like for the memory array device 10.

As shown in FIGS. 1 and 2, in some examples of the present disclosure, each memory cell further comprises an interconnection channel 30 that is electrically connected respectively with the first set of contacts 40 and the CMOS device 20 of the memory cell where the interconnection channel 30 is located, so that the first set of contacts 40 is electrically connected with the CMOS device 20 through the interconnection channel 30. In some examples of the present disclosure, the interconnection channel 30 is disposed in the memory array device 10 and the CMOS device 20 of the memory cell where the interconnection channel 30 is located, and is perpendicular to the array substrate 11 and the CMOS substrate 21. Of course, in other examples, the interconnection channel 30 may also be not perpendicular to the array substrate 11 and the CMOS substrate 21, and may also be perpendicular to the array substrate 11 or be perpendicular to the CMOS substrate 21.

In some examples of the present disclosure, each second memory cell 200 further comprises a second set of contacts 50. In some examples, the second set of contacts 50 is disposed on a side of the CMOS device 20 of the second memory cell 200 facing away from the memory array device 10 of the second memory cell 200, and is electrically connected with the CMOS device 20 of the second memory cell 200.

As shown in FIGS. 1 and 2, in some examples of the present disclosure, the memory array device 10 of the first memory cell 100 is bonded with the CMOS device 20 of the adjacent second memory cell 200, and the first set of contacts 40 of the first memory cell 100 is correspondingly electrically connected with the second set of contacts 50 of the adjacent second memory cell 200 such that the first memory cell 100 is electrically connected with the adjacent second memory cell 200 through the first set of contacts 40 and the second set of contacts 50.

As shown in FIG. 1, in one of the examples of the present disclosure, when there is only one second memory cell 200 in the three-dimensional memory device 1000, the second memory cell 200 is an outer second memory cell 200 stacked on the first memory cell 100, and the first set of contacts 40 of the outer second memory cell 200 is used to connect to an external device (e.g., a control device or a drive circuit, etc.) to achieve functions such as drive, control and the like for the three-dimensional memory device 1000.

As shown in FIG. 2, in another example of the present disclosure, when there are multiple second memory cells 200 in the three-dimensional memory device 1000*b*, the multiple second memory cells 200 are sequentially stacked on the first memory cell 100; for two adjacent ones of the second memory cells 200, the first set of contacts 40 of the second memory cell 200 close to the first memory cell 100 is correspondingly electrically connected with the second set of contacts 50 of the second memory cell 200 far away from the first memory cell 100 such that the two adjacent second memory cells 200 achieve electrical connection through the corresponding first set of contacts 40 and the second set of contacts 50, and then the first memory cell 100 and the multiple second memory cells 200 sequentially stacked on the first memory cell 100 achieve electrical connection. The second memory cell 200 farthest away from the first memory cell 100 along a stacking direction is an outer second memory cell 200 stacked on the first memory cell 100, and the first set of contacts 40 of the outer second memory cell 200 is used to connect to an external device (e.g., a control device or a drive circuit, etc.) to achieve functions such as drive, control and the like for the three-dimensional memory device 1000*b*. It can be understood that the number of memory cells stacked in the three-dimensional memory device 1000*b* is more as compared with the three-dimensional memory device 1000, and thus, the storage density of the three-dimensional memory device 1000*b* is higher.

In the examples of the present disclosure, by sequentially stacking at least two memory cells and achieving electrical connection between the at least two memory cells through the corresponding first set of contacts 40 and the second set of contacts 50, the three-dimensional memory device with a high storage density may be constituted, without the necessity to stack too many memory layers 13 in the memory array device 10 of each memory cell, such that the area of the array substrate 11 of each memory cell is not too large, which is favorable to dispose the array substrate 11 and the CMOS substrate 21 of each memory cell at a proper area ratio, and the idle utilization space in each memory cell can be further reduced and the space utilization rate of the three-dimensional memory device can be increased.

Both the array substrate 11 and the CMOS substrate 21 may be made of a semiconductor material or a non-conductive material, where the semiconductor material includes, but is not limited to, silicon, germanium, silicon germanium, gallium arsenide, silicon on insulator, germanium on insulator or any suitable combination thereof, and the non-conductive material includes, but is not limited to, glass, plastic, or sapphire. In the examples of the present disclosure, both the array substrate 11 and the CMOS substrate 21 are silicon substrates. Except the CMOS substrate 21 of the first memory cell 100, the array substrate 11 and the CMOS substrate 21 of any memory cell in the three-dimensional memory device may be thinned to be favorable to reduce the volume of the three-dimensional memory device. The means of thinning include, but are not limited to, mechanical polishing, wet/dry etching, chemical mechanical polishing, or any combination thereof.

As shown in FIGS. 1 and 2, in each memory array device 10, several memory layers 13 are stacked on a side of the array substrate 11 in a step structure, and several memory strings (e.g., NAND strings) penetrate through and connect together the several memory layers 13, such that the several memory strings and the several memory layers 13 jointly constitute a memory array with a storage function.

In some implementations, each memory layer 13 extends along a lateral direction parallel to the surface of the array substrate 11; along a direction being gradually far away from and perpendicular to the array substrate 11, every two adjacent ones of several memory layers 13 offset the same distance, and shrink by the same extension distance in the lateral direction. It can be understood that every two adjacent memory layers 13 may be flush at one end and shrink by the same distance at the other end in the lateral direction, and may also shrink by the same distance at the two ends respectively in the lateral direction. As shown in FIGS. 1 and 2, in some examples of the present disclosure, every two adjacent memory layers 13 shrink by the same distance at the two ends respectively in the lateral direction. Each memory layer 13 may comprise one or more pairs of conductor/dielectric layers, each of which comprises a conductor layer and a dielectric layer, where specific structures, functions and materials of the conductor layers and the dielectric layers are the same as those of conductor layers and dielectric layers that are commonly used in the prior art, which is thus not repeated herein.

Each of the memory strings comprises a channel structure that extends along a direction perpendicular to the array substrate 11 and penetrates through several memory layers 13, where the channel structure comprises channel holes filled with a semiconductor material (as a semiconductor channel) and a dielectric material (as a memory film). The memory film may comprise a tunneling layer, a charge trap/memory layer and a barrier layer, where the semiconductor channel, the tunneling layer, the charge trap/memory layer and the barrier layer are arranged sequentially along an outward direction from the center of the memory strings. It is to be noted that the specific structure, function and material of the memory strings are the same as those of the memory strings commonly used in the prior art, which is not repeated herein either.

In the three-dimensional memory device provided by the present disclosure, the respective memory array devices 10 of the first memory cell 100 and the second memory cell 200 each include several memory layers 13. As mentioned above, in order to avoid too large area of the array substrate 11, it is not necessary to stack too many memory layers 13 in the memory array device 10 of each memory cell. In the three-dimensional memory device provided by the examples of the present disclosure, the respective memory array devices 10 of the first memory cell 100 and the second memory cell 200 each include a preset number of layers of memory layers 13, and the value of the preset number of layers is an integer greater than 0 and less than 500, e.g., 32, 64, 96 or 128 layers. The number of layers of the memory layers 13 in the respective memory array devices 10 of the first memory cell 100 and the second memory cell 200 may be the same or not the same. In some implementations, the number of layers of the memory layers 13 in the respective memory array devices 10 of the first memory cell 100 and the second memory cell 200 may be the same to be favorable to mass production of the first memory cell 100 and the second memory cell 200 in the same process.

It can be understood that, in each memory cell, the memory array device 10 and the CMOS device 20 may also comprise some other elements respectively, for example, a stack layer covering the memory array or the CMOS circuit, a bonding structure (including, but not limited to, a conductive structure, such as a wire, a plug, a solder bump or a pad or the like) disposed on an inner side surface of the stack layer, and several interconnection conductive channels penetrating through the stack layer and electrically connected with the bonding structure and the memory array or the CMOS circuit respectively, and the like, wherein the stack layer at least includes one insulation layer covering the memory array or the CMOS circuit. The specific structures and functions of the memory array device 10 and the CMOS device 20 are substantially the same as those of the memory array device and the CMOS device in the prior art, which is not repeated herein since they are unrelated to the improvement and innovation of the present disclosure.

As shown in FIGS. 1 and 2, in some examples of the present disclosure, the interconnection channel 30 comprises first interconnection sub-channels 31, second interconnection sub-channels 32 and an interconnection structure 33 electrically connected between the first interconnection sub-channels 31 and the second interconnection sub-channels 32.

In some implementations, the first interconnection sub-channels 31 are disposed in the memory array device 10 and located on a side of the memory array device 10 provided with the memory array, and penetrate through the stack layers of the memory array device 10; the second interconnection sub-channels 32 are disposed in the CMOS device 20 and located on a side of the CMOS device 20 provided with the CMOS circuit, and penetrate through the stack layers of the CMOS device 20, wherein the second interconnection sub-channels 32 correspond to the first interconnection sub-channels 31 in position, and the second interconnection sub-channels 32 are electrically connected with the CMOS circuit at one end far away from the first interconnection sub-channels 31. It is to be noted that the first interconnection sub-channels 31 and the second interconnection sub-channels 32 may be formed using conventional means in the prior art. For example, in some examples of the present disclosure, deep etching may be performed on the respective stack layers of the memory array device 10 and the CMOS device 20 to form filling channels penetrating through the stack layers, and then a conductive material is filled into the filling channels to form the first interconnection sub-channels 31 and the second interconnection sub-channel 32 respectively, where the conductive material includes, but is not limited to, tungsten, cobalt, copper, polysilicon, silicide or any combination thereof. The numbers of the first interconnection sub-channels 31 and the second interconnection sub-channels 32 may be set as one or more as long as the numbers of both of them are correspondingly equal, on which no limitation is imposed.

The interconnection structure 33 comprises first interconnection contacts and second interconnection contacts, where the first interconnection contacts are disposed on inner side (i.e., a side close to the CMOS device) surfaces of the stack layers of the memory array device 10 and correspondingly electrically connected with the first interconnection sub-channels 31, and the second interconnection contacts are disposed on inner side (i.e., a side close to the memory array device) surfaces of the stack layers of the CMOS device 20 and correspondingly electrically connected with the second interconnection sub-channels 32. The first interconnection contacts and the second interconnection contacts include, but are not limited to, conductive structures such as wires, plugs, solder bumps or pads or the like, and structural forms of the first interconnection contacts and the second interconnection contacts may be the same or not the same. As shown in FIGS. 1 and 2, in some examples of the present disclosure, the first interconnection contacts are several solder bumps which are equal to the first interconnection sub-channels 31 in number and electrically connected with the first interconnection sub-channels 31 in a one-to-one correspondence manner; the second interconnection contacts are pads that are correspondingly electrically connected with the second interconnection sub-channels 32 on one side surface and provided with several pins on the other side surface, which correspond to the several solder bumps of the first interconnection contacts one-to-one. It can be understood that when the memory array device 10 and the CMOS device 20 of each memory cell are bonded in a face-to-face configuration, the first interconnection contacts and the second interconnection contacts are bonded at the same time to constitute the interconnection structure 33 such that the first interconnection sub-channels 31 are correspondingly electrically connected with the second interconnection sub-channels 32 through the interconnection structure 33 to constitute the interconnection channel 30 of the memory cell.

Referring to FIGS. 1 and 2 again, in some examples of the present disclosure, the first set of contacts 40 is disposed on an outer side (i.e., a side facing away from the memory array) of the array substrate 11; the array substrate 11 is provided with several first conductive channels 41 in positions corresponding to the first interconnection sub-channels 31 in the memory array device 10 where the array substrate 11 is located; each first conductive channel 41 penetrates through two opposite sides of the array substrate 11 and is electrically connected with a corresponding first interconnection sub-channel 31 such that the first set of contacts 40 is electrically connected to the first interconnection sub-channels 31 through the first conductive channels 41.

The first set of contacts 40 includes, but is not limited to, conductive structures such as wires, plugs, solder bumps or pads or the like. In some examples of the present disclosure, the first set of contacts 40 is pads that are electrically connected with the first conductive channels 41.

The outer side surface of the array substrate 11 is further covered with a first bonding layer 42, and the ends of the first conductive channels 41 far away from the first interconnection sub-channels 31 and the first set of contacts 40 are all embedded in the first bonding layer 42. The first bonding layer 42 may be formed through one or more thin film deposition processes including but not limited to, chemical vapor deposition, physical vapor deposition, atomic layer deposition, or any combination thereof. The first bonding layer 42 comprises at least one dielectric layer made of a dielectric material including but not limited to, silicon oxide or silicon nitride, on which no limitation is imposed.

In some examples of the present disclosure, the first conductive channels 41 may be formed using conventional means such as a through-silicon-via technology, etc. In some implementations, deep etching is performed in positions of the first bonding layer 42 and the array substrate 11 corresponding to several first interconnection sub-channels 31 to form several first vertical channels penetrating through the first bonding layer 42 and the array substrate 11, wherein each of the first vertical channels exposes at least part of a corresponding first interconnection sub-channel 31; then a conductive material is filled within the first vertical channels until the conductive material exceeds the outer side surface of the array substrate 11, so the first conductive channels 41 in contact with the first interconnection sub-channels 31 is formed, and the ends of the first conductive channels 41 far away from the first interconnection sub-channels 31 are located within the first bonding layer 42. The leakage of the conductive material within the first vertical channels may be prevented in a manufacturing process of the first conductive channels 41 to avoid contaminating other manufacturing processes by covering the outer side surface of the array substrate 11 with the first bonding layer 42.

In some examples of the present disclosure, after forming the first conductive channels 41, the positions of the first bonding layer 42 corresponding to the first conductive channels 41 proceed to be etched to form openings exposing end portions of several first conductive channels 41 far away from the first interconnection sub-channels 31, and then the first set of contacts 40 (i.e., the pads) is disposed within the openings such that the first set of contacts 40 is correspondingly electrically connected with the several first conductive channels 41. In some examples of the present disclosure, after the first set of contacts 40 is disposed within the openings of the first bonding layer 42, the dielectric material of the first bonding layer 42 may be filled within the openings again to cover the first set of contacts 40 in order to avoid exposure of the first set of contacts 40, thereby preventing the first set of contacts 40 from damage before bonding connection with the corresponding second set of contacts 50, which is favorable to improve the reliability of the bonding connection of the first set of contacts 40 with the corresponding second set of contacts 50. Of course, in other examples, the first set of contacts 40 may also be exposed. It can be understood that when the first set of contacts 40 within the openings of the first bonding layer 42 is covered by the dielectric material, the first bonding layer 42 is required to be thinned or etched before the bonding connection of the first set of contacts 40 with the corresponding second set of contacts 50, to remove the dielectric material in order to expose the first set of contacts 40 within the openings.

As shown in FIGS. 1 and 2, in some examples of the present disclosure, the second set of contacts 50 of the second memory cell is disposed on an outer side (i.e., a side facing away from the CMOS circuit) of the CMOS substrate 21 of the second memory cell 200. The CMOS substrate 21 is provided with several second conductive channels 60 in positions corresponding to the second interconnection sub-channels 32 in the CMOS device 20 where the CMOS substrate 21 is located. Each of the second conductive channels 60 penetrates through two opposite sides of the CMOS substrate 21 and is electrically connected with the second set of contacts 50 and the CMOS circuit of the CMOS device 20 respectively, so that the second set of contacts 50 is electrically connected to the CMOS circuit of the CMOS device 20 through the second conductive channels 60. Of course, in other examples, the second conductive channels 60 may not correspond to the second interconnection sub-channels 32 as long as the second conductive channels 60 are electrically connected to the CMOS circuit of the CMOS device 20.

The second set of contacts 50 includes, but is not limited to, conductive structures such as wires, plugs, solder bumps or pads or the like. In some examples of the present disclosure, the second set of contacts 50 are several solder bumps that are electrically connected with several second conductive channels 60 in a one-to-one correspondence manner.

The outer side surface of the CMOS substrate 21 of the second memory cell 200 is covered with a second bonding layer 52, and the ends of the second conductive channels 60 far away from the second interconnection sub-channels 32 and the second set of contacts 50 are all embedded in the second bonding layer 52. Similar to the first bonding layer 42, the second bonding layer 52 may also be formed through one or more thin film deposition processes that include, but are not limited to, chemical vapor deposition, physical vapor deposition, atomic layer deposition, or any combination thereof; likewise, the second bonding layer 52 includes at least one dielectric layer made of a dielectric material including but not limited to, silicon oxide or silicon nitride, on which no limitation is imposed.

In some examples of the present disclosure, the formation processes of the second conductive channels 60 and the first conductive channels 41 are substantially the same. In some implementations, deep etching may be first performed in positions of the second bonding layer 52 and the CMOS substrate 21 corresponding to several second interconnection sub-channels 32 to form several second vertical channels penetrating through the second bonding layer 52 and the CMOS substrate 21, wherein each of the second vertical channels exposes at least part of a corresponding second interconnection sub-channel 32; then a conductive material is filled within the second vertical channels until the conductive material exceeds the outer side surface of the CMOS substrate 21, so the second conductive channels 60 in contact with the second interconnection sub-channels 32 is formed, such that the second conductive channels 60 are electrically connected with the CMOS circuit, and the ends of the second conductive channels 60 far away from the second interconnection sub-channels 32 are located within the second bonding layer 52. The leakage of the conductive material within the second vertical channels may be prevented in a manufacturing process of the second conductive channels 60 to avoid contaminating other manufacturing processes by covering the outer side surface of the CMOS substrate 21 with the second bonding layer 52. The conductive materials filled within the second vertical channels and the aforementioned first vertical channels include, but are not limited to, tungsten, copper, aluminum, polysilicon, silicide or any combination thereof, and may be the same or different.

It is to be noted that, in some examples of the present disclosure, a manufacturing process of the second set of contacts 50 is different from that of the first set of contacts 40 in that: after forming the second conductive channels 60, one solder bump is directly disposed within each of the second vertical channels of the second bonding layer 52, and several solder bumps within several second vertical channels constitute the second set of contacts 50. In addition, like the first set of contacts 40, the second set of contacts 50 may be covered or exposed in some examples of the present disclosure. In some implementations, the second set of contacts 50 may be covered to prevent the second set of contacts 50 from damage before bonding connection with the corresponding first set of contacts 40, which is also favorable to improve the reliability of the bonding connection of the first set of contacts 40 with the corresponding second set of contacts 50. It can be understood that when the solder bump within each of the second vertical channels of the second bonding layer 52 is covered by the dielectric material of the second bonding layer 52 (i.e., the second set of contacts 50 is covered), the second bonding layer 52 is required to be thinned or etched before the bonding connection of the first set of contacts 40 with the corresponding second set of contacts 50, in order to remove the dielectric material within each of the second vertical channels to expose the solder bump within each second vertical channel, i.e., to expose the second set of contacts 50 so as to bond with the corresponding first set of contacts 40.

It can be understood that, as shown in FIGS. 1 and 2, for any two adjacent memory cells, after the first set of contacts 40 of a memory cell located below is correspondingly bonded with the second set of contacts 50 of the other memory cell located above, the respective CMOS circuits of the two adjacent memory cells are connected together, and the first bonding layer 42 of the memory cell located below is integrally attached to the second bonding layer 52 of the other memory cell located above.

Referring to FIGS. 1 and 2 again, in some examples of the present disclosure, the three-dimensional memory device further comprises an isolation layer 300 and an array pad 400 embedded in the isolation layer 300. In some implementations, the isolation layer 300 covers a side of the outer second memory cell 200 facing away from the first memory cell 100 and the first set of contacts 40 of the outer second memory cell 200. The isolation layer 300 is provided with an accommodation cavity in a position corresponding to the first set of contacts 40 of the outer second memory cell 200, and the accommodation cavity corresponds to at least part of the first set of contacts 40. The array pad 400 is disposed within the accommodation cavity of the isolation layer 300 and electrically connected with the first set of contacts 40 of the outer second memory cell 200, and the three-dimensional memory device is electrically connected to the aforementioned external device through the array pad 400.

The accommodation cavity of the isolation layer 300 may be formed by conventional means such as etching and the like, which is not repeated herein. The array pad 400 and the aforementioned solder bumps, pads and the like may be fabricated by conventional means in the prior art, which is thus not repeated.

It is to be noted that, similar to the first bonding layer 42 and the second bonding layer 52, the isolation layer 300 may also be formed through one or more thin film deposition processes that include, but are not limited to, chemical vapor deposition, physical vapor deposition, atomic layer deposition, or any combination thereof; the isolation layer 300 may also include at least one dielectric layer made of a dielectric material including but not limited to, silicon oxide or silicon nitride, on which no limitation is imposed.

The accommodation cavity of the isolation layer 300 may be a cavity with one end open to the outer second memory cell 200, such that the array pad 400 is covered by the isolation layer 300 before being connected to the external device, thereby being favorable to protect the array pad 400; however, when the array pad 400 is electrically connected to the external device, a position of the isolation layer 300 corresponding to the accommodation cavity is required to be thinned or etched to expose the array pad 400. Of course, the accommodation cavity of the isolation layer 300 may also be a cavity structure with openings at both ends, such that the array pad 400 is exposed to facilitate direct electrical connection with the external device.

As shown in FIGS. 1 and 2, in some examples of the present disclosure, the isolation layer 300 covers the outer side of the first bonding layer 42 of the outermost second memory cell 200. It can be understood that both the isolation layer 300 and the first bonding layer 42 are formed by dielectric materials, and thus, the materials of the isolation layer 300 and the first bonding layer 42 may be the same or different. That means the isolation layer 300 and the first bonding layer 42 may be formed either in different thin film deposition processes or in the same thin film deposition process. In some implementations, the isolation layer 300 and the first bonding layer 42 are formed in different thin film deposition processes, such that the first set of contacts 40 and the array pad 400 may be disposed at different times in different thin film deposition processes, which is convenient in operation; furthermore, the first bonding layer 42 and the isolation layer 300 are formed at different times, and when the first bonding layer 42 and the isolation layer 300 are etched separately, the etching depth is small, thereby being favorable to improve the etching efficiency and precision.

As shown in FIGS. 1 and 2, in some examples of the present disclosure, the three-dimensional memory device further comprises a protective layer 500 stacked on an outer side face of the isolation layer 300, wherein the protective layer 500 covers the isolation layer 300 and is provided with an opening in a position corresponding to the array pad 400, and at least part of the array pad 400 is exposed through the opening to connect to the external device. Of course, in other examples, the protective layer 500 may also cover the array pad 400 to protect the array pad 400; however, when electrically connecting the array pad 400 with the external device, a position of the protective layer 500 corresponding to the array pad 400 is required to be thinned or etched to expose the array pad 400.

By covering the isolation layer 300 with the protective layer 500, the isolation layer 300 can be protected against damage, thereby preventing the array pad 400 from loosening due to the damage of the isolation layer 300 and ensuring the connection reliability of the array pad 400.

The protective layer 500 may be made of a material such as silicon nitride or silicon oxide or the like, and the opening may be formed by conventional means such as etching and the like, which is not repeated herein.

Referring to FIG. 3, the present disclosure further provides a manufacturing method of the above-mentioned three-dimensional memory device, which comprises:

S1, providing a first memory cell and a second memory cell, each of which comprise a first set of contacts, and a memory array device and a CMOS device that are stacked and electrically connected with each other, wherein the first set of contacts is disposed on a side of the memory array device facing away from the CMOS device and is electrically connected with the CMOS device.

Figure 4:
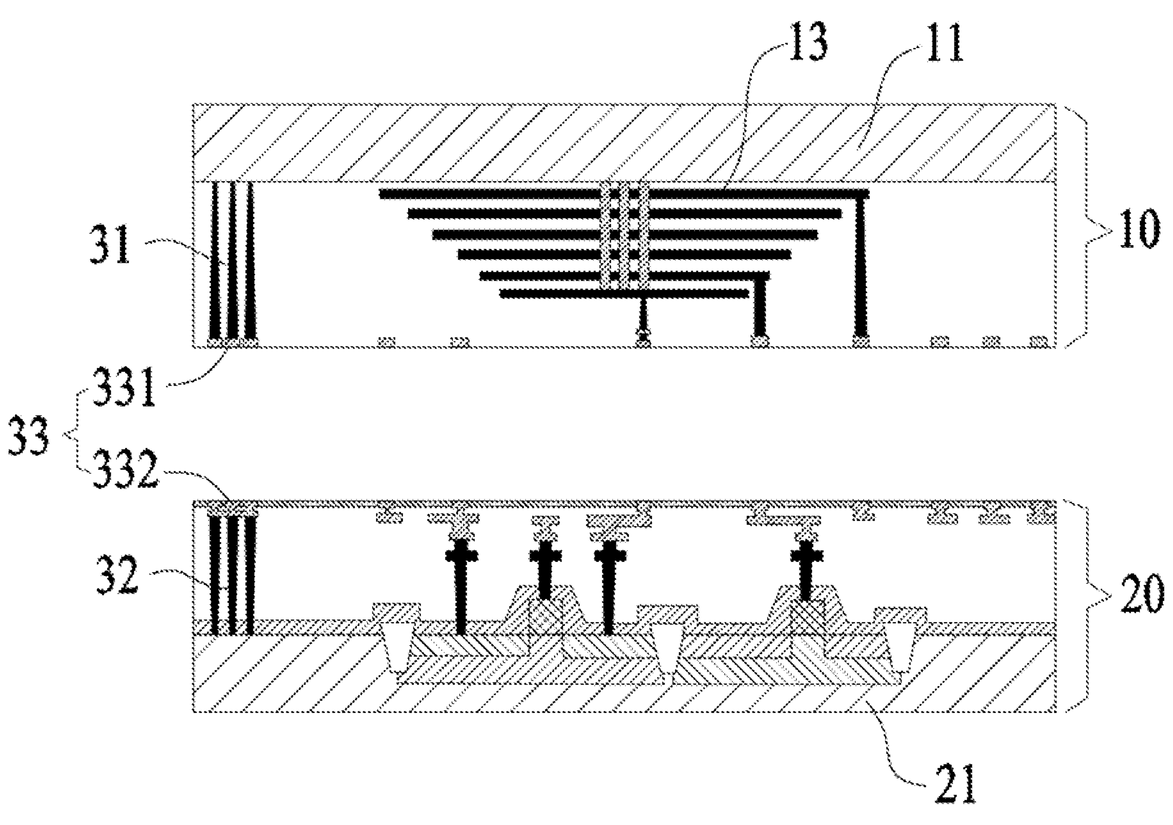

In some implementations, referring to FIGS. 4 to 7 together, the manufacturing process of the memory cell is as follows:

The memory array device 10 and the CMOS device 20 are provided. As shown in FIG. 4, the memory array device 10 comprises an array substrate 11, a memory array disposed on an inner side (i.e., a side close to the CMOS device 20) of the array substrate 11, first interconnection sub-channels 31 disposed in the memory array, and first interconnection contacts 331 disposed on an inner side surface of the memory array device 10 and electrically connected with the first interconnection sub-channels 31, wherein the memory array comprises several memory layers 13 in a step structure and several memory strings penetrating through and connecting together the several memory layers 13; as shown in FIG. 4, the CMOS device 20 comprises a CMOS substrate 21, a CMOS circuit disposed on an inner side (i.e., a side close to the memory array device 10) of the CMOS substrate 21, second interconnection sub-channels 32 disposed on one side of the CMOS circuit and electrically connected with the CMOS circuit, and second interconnection contacts 332 disposed on an inner side surface of the CMOS device 20 and electrically connected with the second interconnection sub-channels 32. It is to be noted that the specific features, functions and formation processes of the array substrate 11, the several memory layers 13, the several memory strings, the CMOS substrate 21, the first interconnection sub-channels 31, the second interconnection sub-channels 32, the first interconnection contacts 331 and the second interconnection contacts 332 may refer to the corresponding contents in the above-mentioned three-dimensional memory device, which is not repeated here. In addition, the memory array device 10 and the CMOS device 20 further comprise some other elements respectively, and the specific structures and functions of the memory array device 10 and the CMOS device 20 are substantially the same as those of the existing memory array device and CMOS device, which is not repeated either herein since they are unrelated to the improvement and innovation of the present disclosure.

Figure 5:
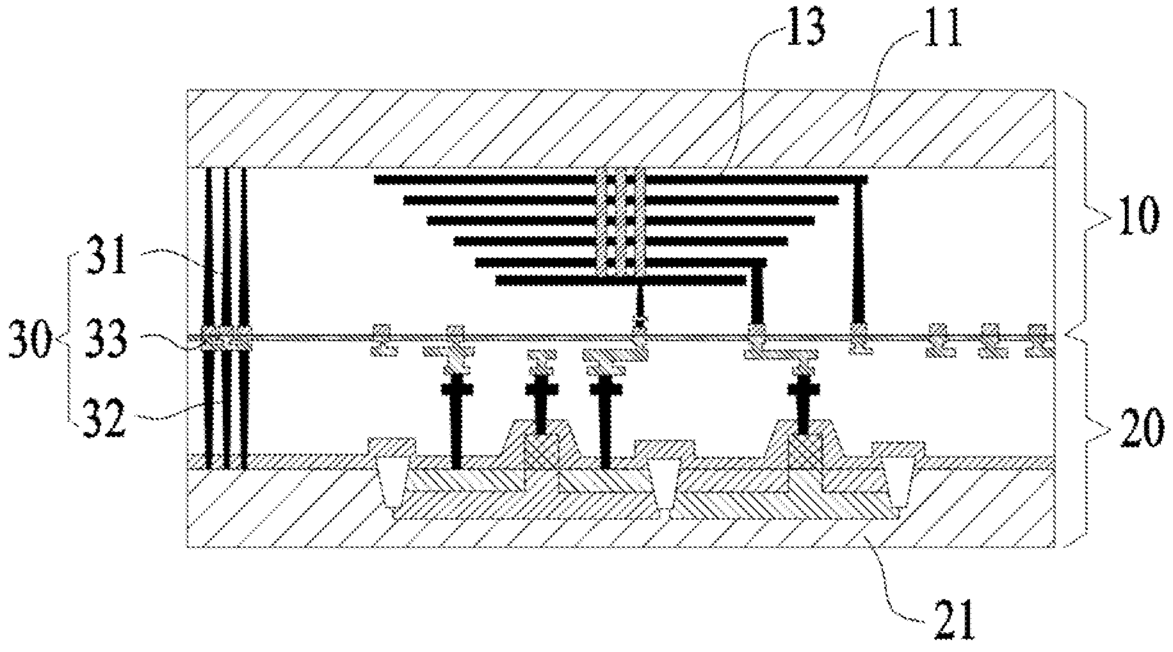

The memory array device 10 and the CMOS device 20 are bonded face-to-face. As shown in FIG. 5, after alignment bonding of the memory array device 10 and the CMOS device 20, the aforementioned first interconnection contacts 331 and the second interconnection contacts 332 (as shown in FIG. 4) are also bonded to constitute an interconnection structure 33, such that the aforementioned first interconnection sub-channels 31 are correspondingly electrically connected with the second interconnection sub-channels 32 through the interconnection structure 33, thereby constituting an interconnection channel 30 of the memory cell that is electrically connected with the first set of contacts 40 and the CMOS device 20 of the memory cell where the interconnection channel 30 is located, so that the first set of contacts 40 is electrically connected to the CMOS device 20 through the interconnection channel 30.

Figure 6:
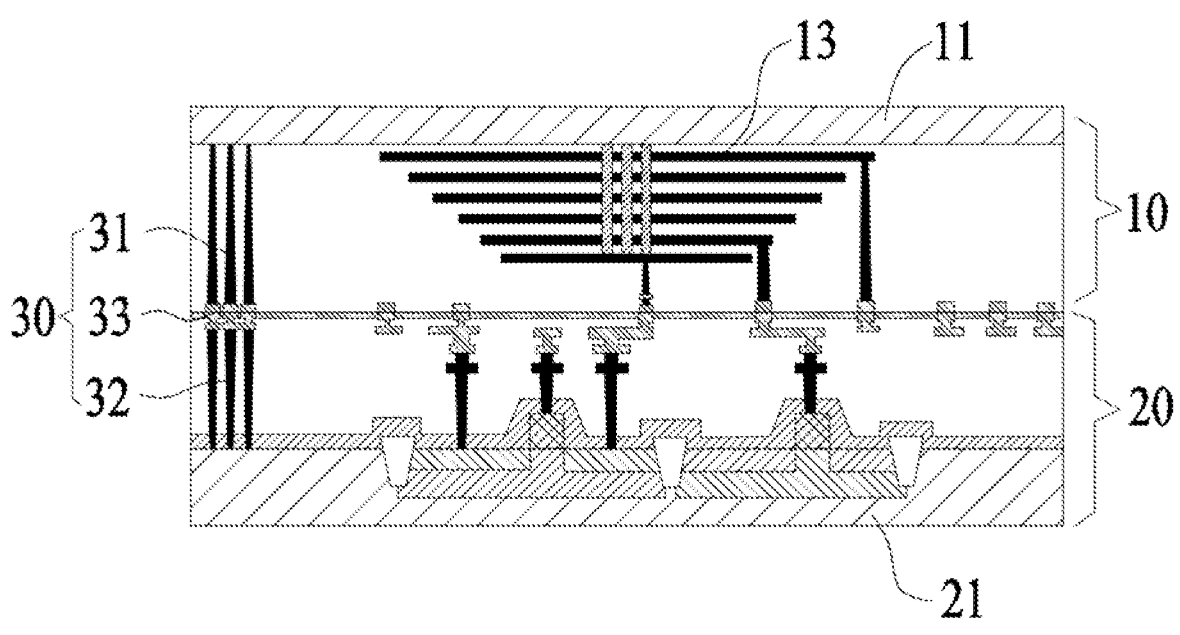

As shown in FIG. 6, an outer side (i.e., a side facing away from the memory array) of the array substrate 11 of the memory array device 10 is thinned. The means of thinning include, but are not limited to, mechanical polishing, wet/dry etching, chemical mechanical polishing, or any combination thereof.

Figure 7:
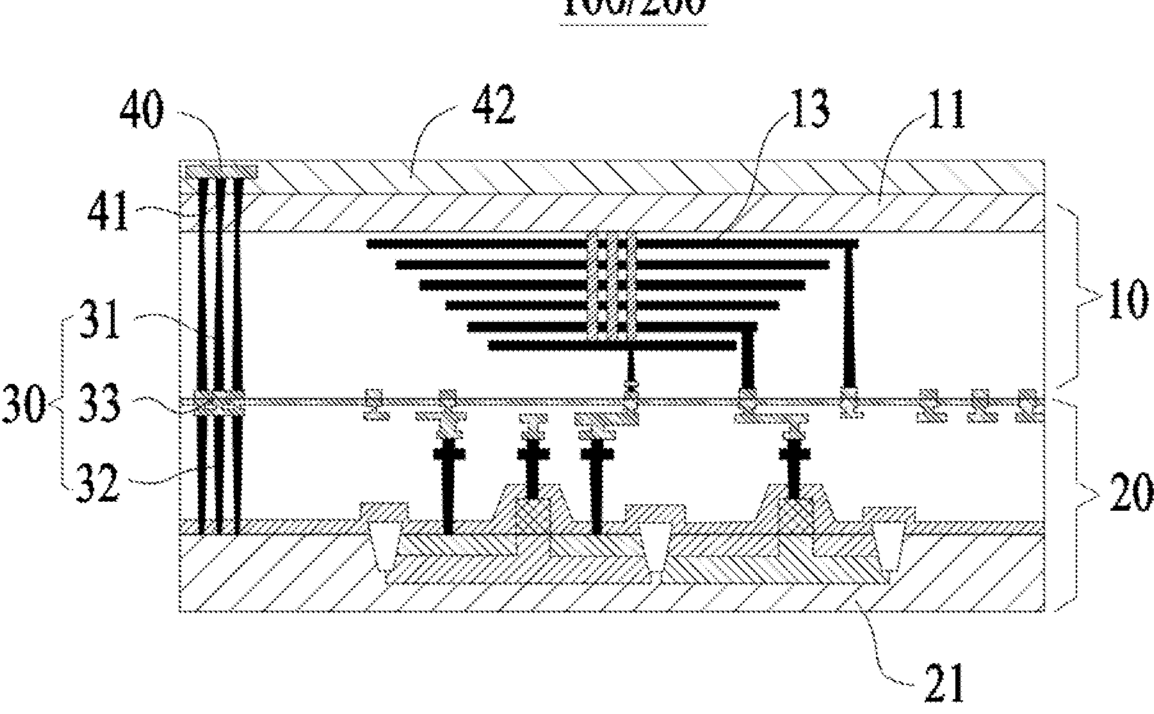

The first set of contacts 40 are formed on the outer side of the memory array device 10, so that the first set of contacts 40 is electrically connected to the first interconnection sub-channels 31. As shown in FIG. 7, in some examples of the present disclosure, the outer side surface of the array substrate 11 is covered with a first bonding layer 42; first conductive channels 41 penetrating through the array substrate 11 and electrically connected with the first interconnection sub-channels 31 may be formed by conventional technical means; the ends of the first conductive channels 41 far away from the first interconnection sub-channels 31 and the first set of contacts 40 are all embedded in the first bonding layer 42; and the first set of contacts 40 are electrically connected to the first interconnection sub-channels 31 through the first conductive channels 41. Likewise, the specific features, functions or formation processes of the first bonding layer 42 and the first conductive channels 41 may refer to the corresponding contents in the above-mentioned three-dimensional memory device, which is not repeated here.

The first memory cell 100 and the same portions of the second memory cell 200 as the first memory cell 100 may be fabricated through the above-described operations.

S2, thinning a side of the CMOS device of the second memory cell facing away from the memory array device of the second memory cell. That is, a side of the CMOS substrate of the second memory cell facing away from the CMOS circuit is thinned, and the means of thinning include, but are not limited to, mechanical polishing, wet/dry etching, chemical mechanical polishing, or any combination thereof.

Figure 8:
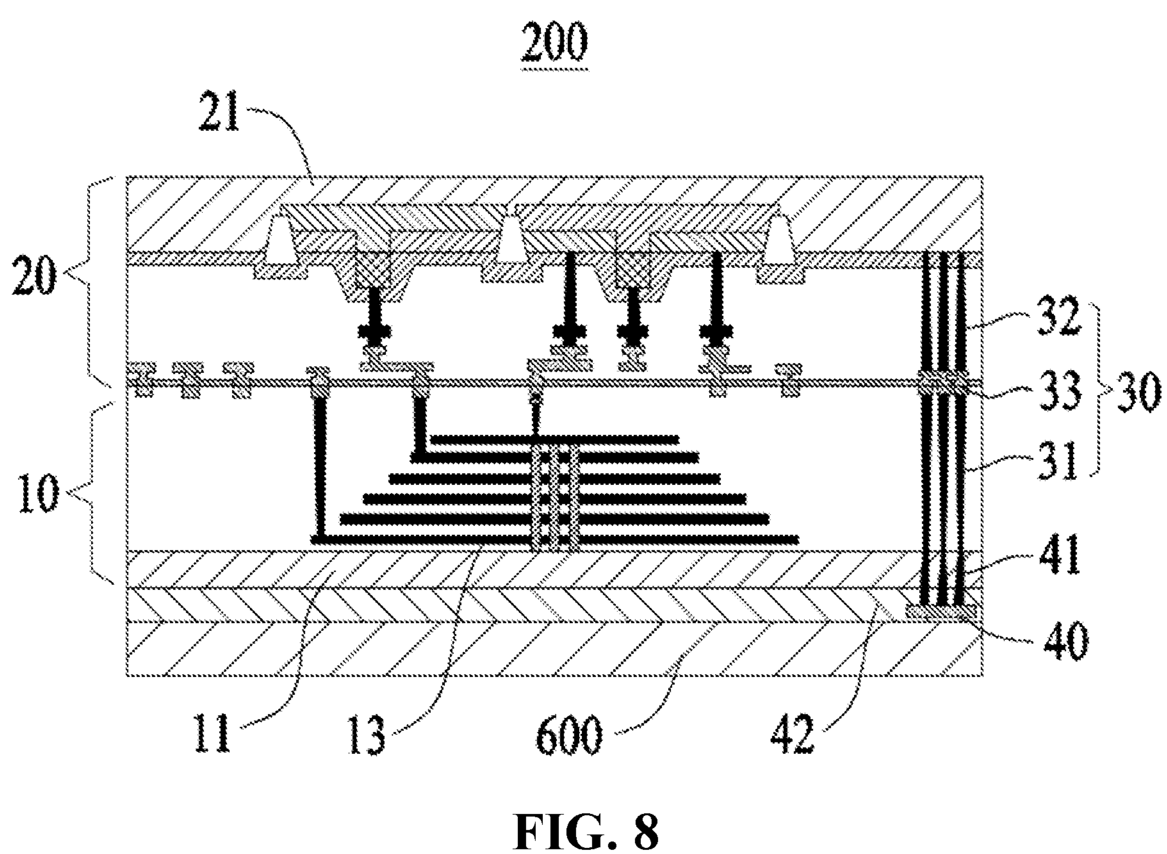
FIG. 8 is a sectional schematic diagram of a second memory cell as shown in FIG. 7 after attaching a carrier to a side of a memory array device facing away from a CMOS device and turning the second memory cell upside down.
Figure 9:
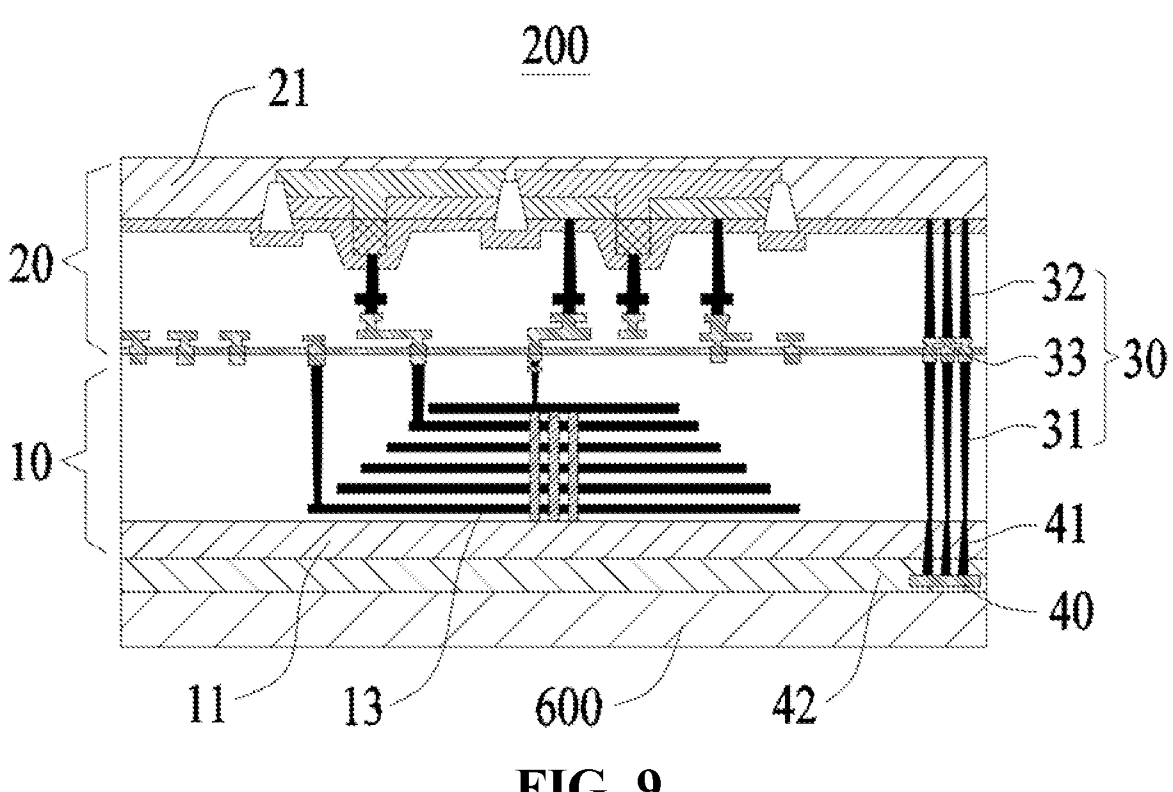
FIG. 9 is a sectional schematic diagram of a second memory cell as shown in FIG. 8 after a CMOS substrate is thinned.

Referring to FIGS. 8 and 9 together, in some examples of the present disclosure, before S2, the manufacturing method of the three-dimensional memory device further comprises: providing a carrier, and attaching the carrier to a side of the memory array device of the second memory cell facing away from the CMOS device of the second memory cell, so that the carrier covers the side of the memory array device of the carried second memory cell facing away from the CMOS device of the second memory cell and the first set of contacts of the second memory cell.

In some implementations, as shown in FIGS. 8 and 9, first the second memory cell 200 is turned upside down, such that the memory array device 10 of the second memory cell 200 is at the bottom; then the carrier 600 is attached to the outer side (i.e., a side facing away from the CMOS device 20 of the second memory cell 200) of the memory array device 10 of the second memory cell 200, so that the carrier 600 covers the outer side of the memory array device 10 of the carried second memory cell 200 and the first set of contacts 40; and finally, the CMOS substrate 21 of the second memory cell 200 is thinned. By attaching the carrier 600 to the outer side of the memory array device 10 of the second memory cell 200, the carrier 600 can play a role for supporting the second memory cell 200, thereby being favorable to reduce and even avoid deformation of the second memory cell 200 in a process of transportation or thinning of the CMOS substrate 21.

The carrier 600 may be made of glass, sapphire or a semiconductor material, on which no limitation is imposed.

Attaching the carrier 600 to the outer side of the memory array device 10 of the second memory cell 200 comprises:

First, coating at least one of a side of the carrier 600 facing the second memory cell 200 and the outer side of the memory array device 10 of the second memory cell 200 with any bonding adhesive of a thermal curing adhesive, an ultraviolet irradiation curing adhesive, a thermal decomposition adhesive or a laser decomposition adhesive. In some implementations, both the side of the carrier 600 facing the second memory cell 200 and the outer side of the memory array device 10 of the second memory cell 200 are coated with the bonding adhesive to enhance the adhesion between the carrier 600 and the outer side of the memory array device 10 of the second memory cell 200.

Then, the carrier 600 is bonded to the outer side of the memory array device 10 of the second memory cell 200 through a temporary or a permanent bonding process. The temporary bonding process refers to a process means that is used to bond the carrier 600 to the outer side of the memory array device 10 of the second memory cell 200 and can easily remove the carrier 600 from the outer side of the memory array device 10 as required, wherein the carrier 600 is easy to remove. The permanent bonding process refers to a process means that is used to bond the carrier 600 to the outer side of the memory array device 10 of the second memory cell 200 and may remove the carrier 600 from the outer side of the memory array device 10 by additionally applying a large external force, wherein the bonding connection between the carrier 600 and the memory array device 10 of the second memory cell 200 is firm.

It can be understood that, in some examples of the present disclosure, the outer side of the memory array device 10 of the second memory cell 200 is covered with the first bonding layer 42, and thus, in some implementations, the carrier 600 may be bonded to the outer side of the first bonding layer 42.

S3, forming a second set of contacts on a side of the CMOS device of the second memory cell facing away from the memory array device of the second memory cell, wherein the second set of contacts is electrically connected with the CMOS device of the second memory cell.

Figure 10:
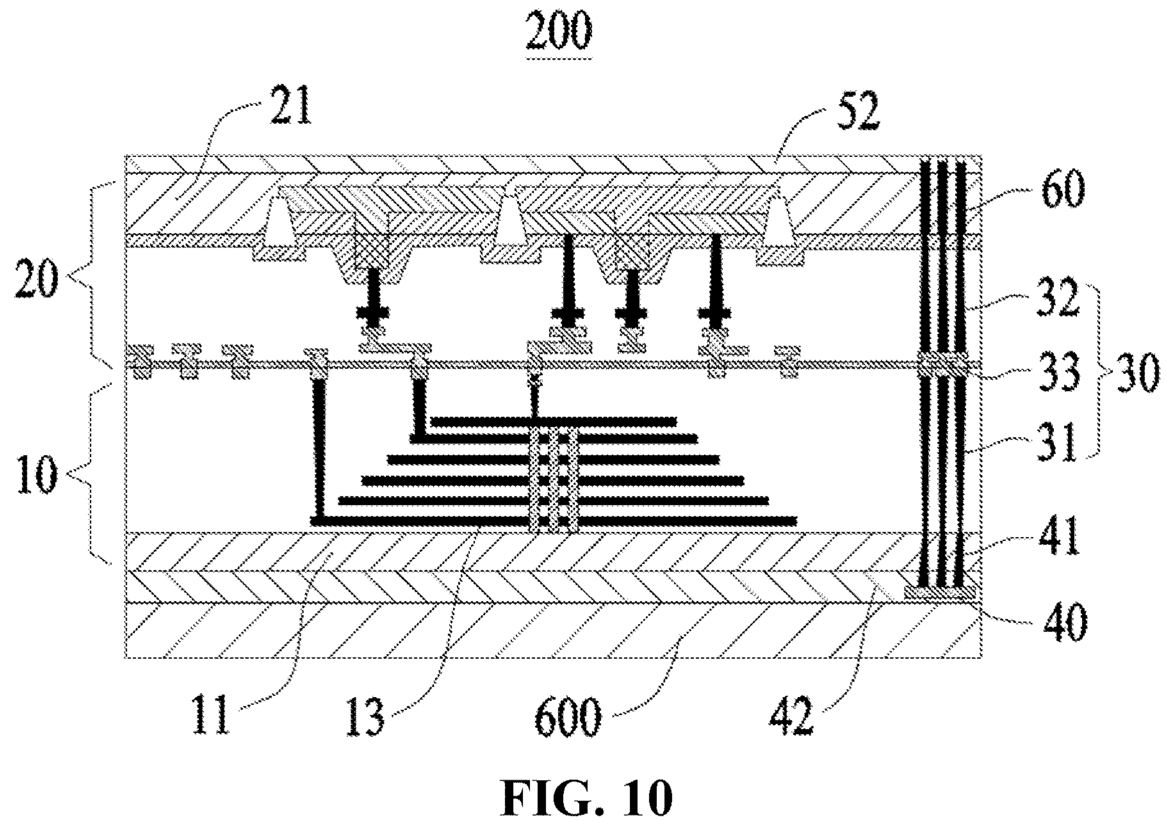
FIG. 10 is a sectional schematic diagram of a second memory cell as shown in FIG. 9 after forming a conductive channel on a CMOS substrate and sequentially covering a side of the CMOS substrate facing away from a memory array device with a first insulation layer and a second insulation layer.
Figure 11:
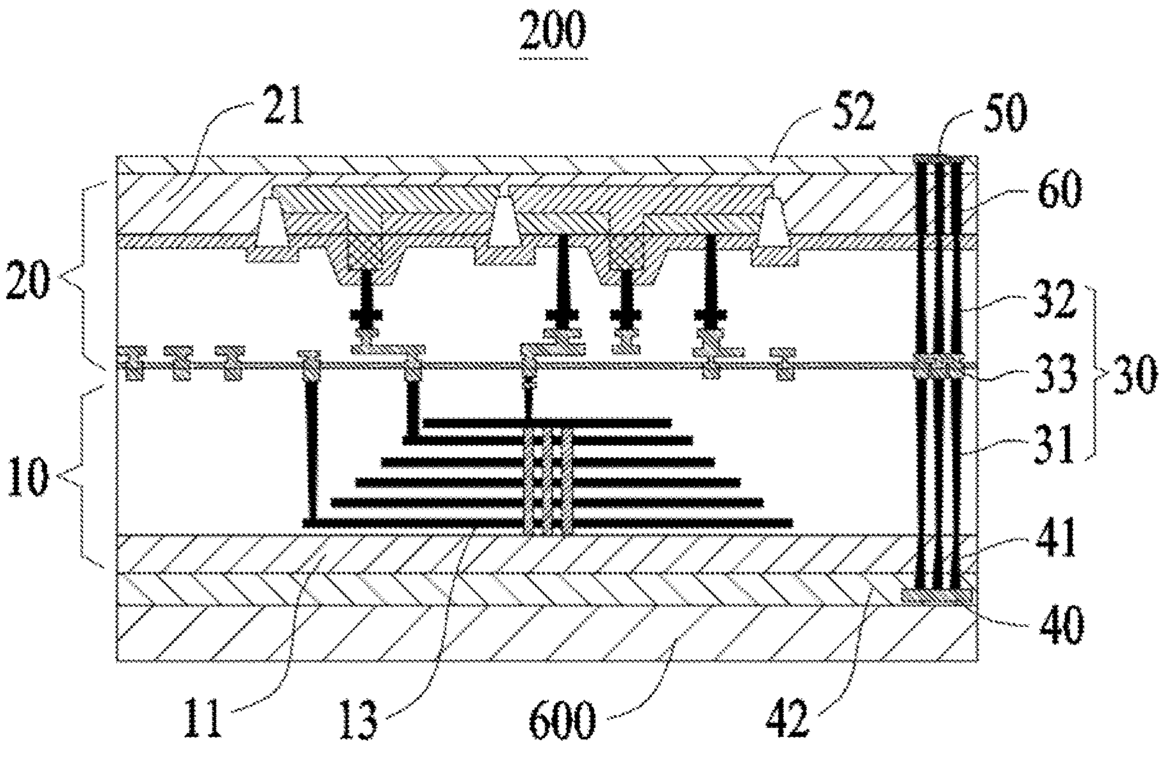
FIG. 11 is a sectional schematic diagram of a second memory cell as shown in FIG. 10 after forming a second set of contacts on a second insulation layer and being covered with a second bonding layer.

Referring to FIGS. 10 and 11 together, in some examples of the present disclosure, S3 of the manufacturing method of the three-dimensional memory device comprises:

- forming vias (i.e., the aforementioned second vertical channels) penetrating through the CMOS substrate 21 on the CMOS substrate 21 of the second memory cell 200, wherein the vias expose at least a part of the interconnection channel 30 (i.e., at least a part of the aforementioned second interconnection sub-channels 32) of the second memory cell 200;
- filling a conductive medium within the vias to form conductive channels (i.e., the aforementioned second conductive channels 60) that are electrically connected with the interconnection channel 30 of the second memory cell 200; and
- forming a second set of contacts 50 of the second memory cell 200 from ends of the conductive channels far away from the interconnection channel 30 of the second memory cell 200 (i.e., ends of the second conductive channels 60 far away from the second interconnection sub-channels 32), so that the second set of contacts 50 is electrically connected with the interconnection channel 30 of the second memory cell 200 through the conductive channels.

As shown in FIGS. 10 and 11, before forming the second set of contacts 50, the outer side (i.e., the side facing away from the CMOS circuit) surface of the CMOS substrate 21 of the second memory cell 200 is first coated with a second bonding layer 52; then, the second conductive channels 60 penetrating through the CMOS substrate 21 and electrically connected with the second interconnection sub-channels 32 may be formed by conventional technical means; the ends of the second conductive channels 60 far away from the second interconnection sub-channels 32 and the second set of contacts 50 are all embedded in the second bonding layer 52; and the second set of contacts 50 is electrically connected to the CMOS circuit of the CMOS device 20 through the second conductive channels 60, and electrically connected to the second interconnection sub-channels 32 of the interconnection channel 30 at the same time. Likewise, the specific features, functions or formation processes of the second bonding layer 52 and the second conductive channels 60 may refer to the corresponding contents in the above-mentioned three-dimensional memory device, which is not repeated here.

After forming the second set of contacts 50 on the outer side of the CMOS device 20 of the second memory cell 200 (i.e., a side facing away from the memory array device 10, i.e., the outer side of the CMOS substrate), the manufacturing method of the three-dimensional memory device further comprises S4: stacking the second memory cell on a side of the memory array device of the first memory cell facing away from the CMOS device of the first memory cell, and bonding the memory array device of the first memory cell with the CMOS device of the second memory cell, so that the first set of contacts of the first memory cell is correspondingly electrically connected with the second set of contacts of the second memory cell.

Figure 12:
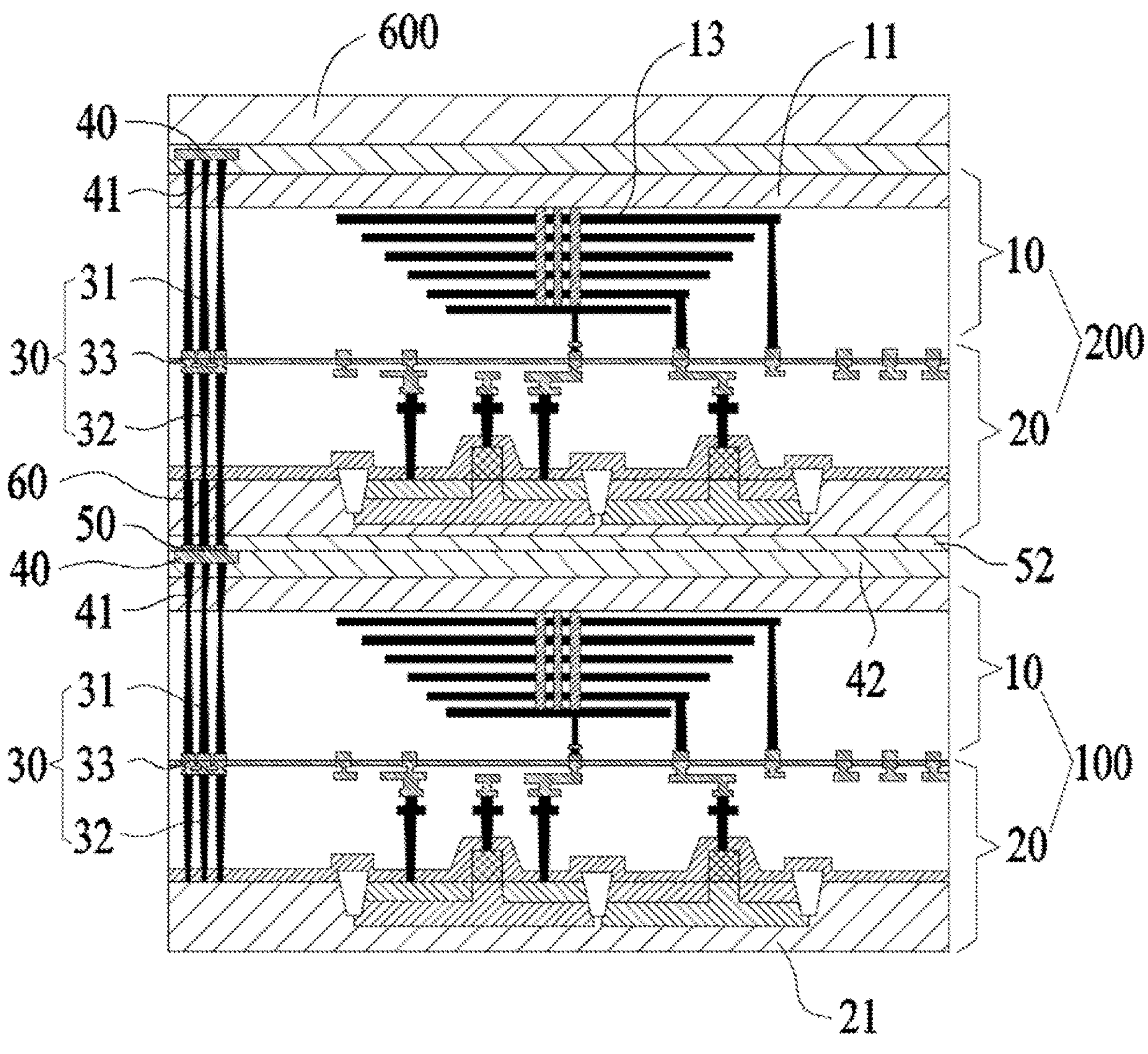
FIG. 12 is a sectional schematic diagram of a second memory cell as shown in FIG. 11 after turning the second memory cell upside down and bonding the second memory cell with a first memory cell.

In some implementations, referring to FIG. 12, after the carrier 600 is bonded to the outer side of the memory array device 10 of the second memory cell 200, the second memory cell 200 is turned upside down, so that the CMOS device 20 of the second memory cell 200 faces the memory array device 10 of the first memory cell 100; then the CMOS device 20 of the second memory cell 200 is face-to-face bonded with the memory array device 10 of the first memory cell 100, so that the first set of contacts 40 of the first memory cell 100 is correspondingly electrically connected with the second set of contacts 50 of the second memory cell 200 and then the first memory cell 100 electrically connects with the second memory cell 200 through the corresponding first set of contacts 40, the second set of contacts 50 and the respective interconnection channel 30 of each memory cell. At this time, the first bonding layer 42 of the first memory cell 100 is attached to the second bonding layer 52 of the second memory cell 200.

Figure 13:
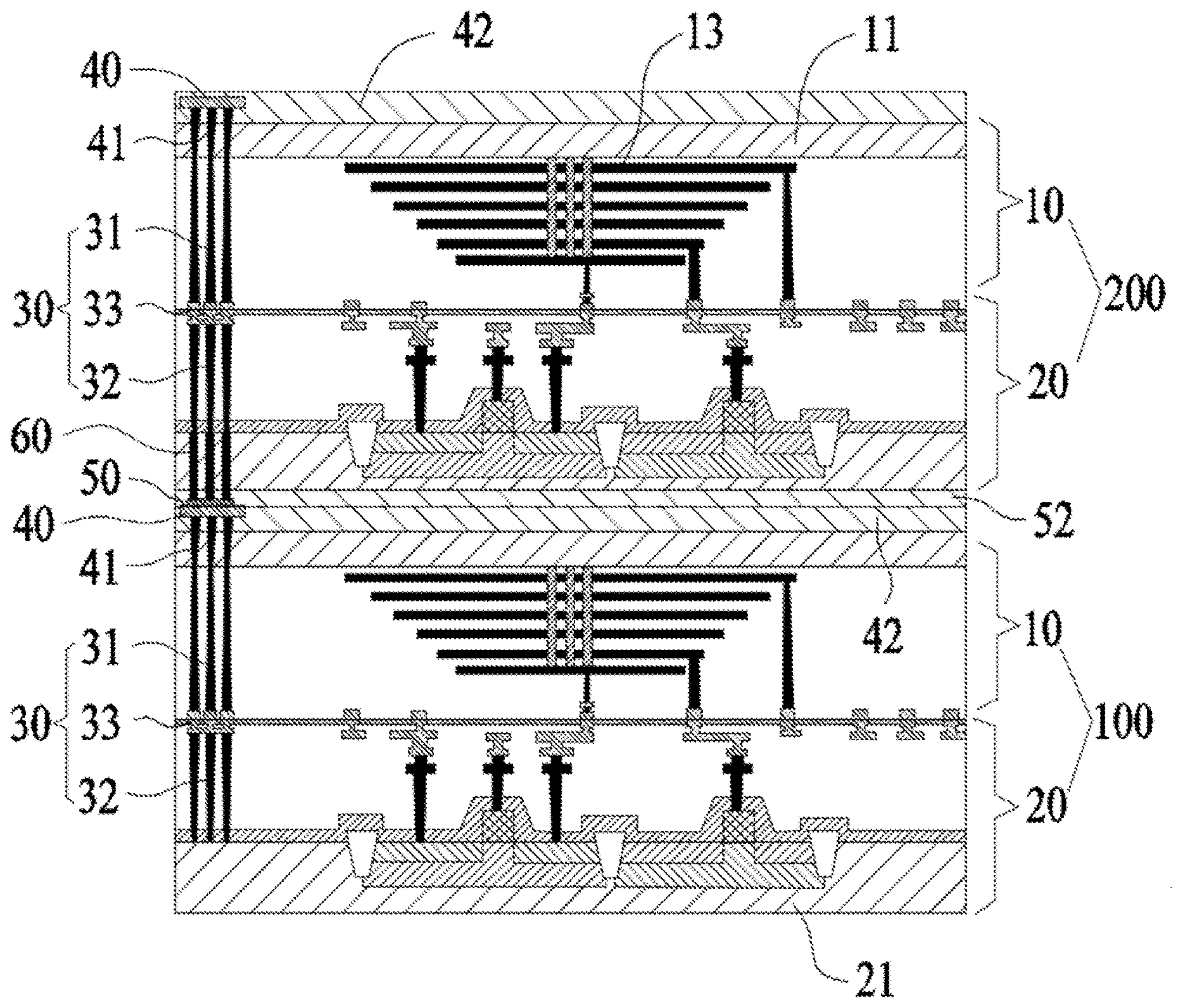
FIG. 13 is a sectional schematic diagram of a first memory cell and a second memory cell as shown in FIG. 12 after removing a carrier from the second memory cell and thinning a first bonding layer of the second memory cell to expose a first set of contacts.

Referring to FIG. 13, in some examples of the present disclosure, when the carrier 600 is bonded to the outer side of the memory array device 10 of the second memory cell 200, after stacking the second memory cell 200 onto the first memory cell 100 and bonding the CMOS device 20 of the second memory cell 200 with the memory array device 10 of the first memory cell 100, the manufacturing method of the three-dimensional memory device further comprises: removing the carrier 600 to expose the first set of contacts 40 of the second memory cell 200.

Referring to FIG. 1, in some examples of the present disclosure, after bonding the CMOS device 20 of the second memory cell 200 with the memory array device 10 of the first memory cell 100 and exposing the first set of contacts 40 of the second memory cell 200, the manufacturing method of the three-dimensional memory device further comprises:

forming an isolation layer 300 on a side of the memory array device 10 of the outer second memory cell 200 facing away from the CMOS device 20 of the outer second memory cell 200, the isolation layer 300 covering the side of the memory array device 10 of the outer second memory cell 200 facing away from the CMOS device 20 of the outer second memory cell 200 and the first set of contacts 40 of the outer second memory cell 200, wherein the outer second memory cell 200 is a second memory cell 200 that is stacked on the first memory cell 100 and farthest away from the first memory cell 100 along a stacking direction;

disposing an array pad 400 within the isolation layer 300, and correspondingly electrically connecting the array pad 400 with the first set of contacts 40 of the outer second memory cell; and forming a protective layer 500 with an opening on a side of the isolation layer 300 facing away from the outer second memory cell 200, so that the protective layer 500 covers the isolation layer 300 and the opening exposes the array pad 400, wherein the isolation layer 300 covers a side of the first bonding layer 42 of the outer second memory cell 200 facing away from the array substrate 11; the exposed array pad 400 is used to connect to an external device (e.g., a control device or a drive circuit, etc.); the protective layer 500 is used to protect the isolation layer 300 against damage to ensure the connection reliability of the array pad 400; and the specific features, functions or formation processes of the isolation layer 300, the array pad 400 and the protective layer 500 may refer to the corresponding contents in the above-mentioned three-dimensional memory device, which is not repeated here.

In some examples of the present disclosure, through the above-mentioned operations, the first memory cell 100 and the second memory cell 200 may be stacked to constitute the three-dimensional memory device 1000 (as shown in FIG. 1) with a high storage density, without the necessity to stack too many memory layers 13 in the memory array device 10 of each memory cell, such that the area of the array substrate 11 of each memory cell is not too large, which is favorable to dispose the array substrate 11 and the CMOS substrate 21 of each memory cell at a proper area ratio, and the idle utilization space in each memory cell can be further reduced and the space utilization rate of three-dimensional memory device can be increased.

In some implementations, in the three-dimensional memory device 1000, the respective memory array devices 10 of the first memory cell 100 and the second memory cell 200 each include a preset number of layers of memory layers 13, and the value of the preset number of layers is an integer greater than 0 and less than 500, e.g., 32, 64, 96 or 128 layers. The number of layers of the memory layers 13 in the respective memory array devices 10 of the first memory cell 100 and the second memory cell 200 may be the same or not the same. In some implementations, the number of layers of the memory layers 13 in the respective memory array devices 10 of the first memory cell 100 and the second memory cell 200 may be the same to be favorable to mass production of the first memory cell 100 and the second memory cell 200 in the same process.

Referring to FIG. 2, in some other examples of the present disclosure, the number of the second memory cells 200 may be set as multiple, and the manufacturing method of the three-dimensional memory device comprises:

stacking one of second memory cells 200 on a side of the memory array device 10 of the first memory cell 100 facing away from the CMOS device 20 of the first memory cell 100, and bonding a CMOS device 20 of the one of the second memory cells 200 to the memory array device 10 of the first memory cell 100, so that a second set of contacts 50 of the one of the second memory cells 200 is correspondingly electrically connected with the first set of contacts 40 of the first memory cell 100; and stacking another one of the second memory cells 200 on a side of a memory array device 10 of an outer second memory cell 200 facing away from a CMOS device 20 of the outer second memory cell 200, and bonding a CMOS device 20 of the another one of second memory cells 200 with the memory array device 10 of the outer second memory cell 200, so that a first set of contacts 40 of the outer second memory cell 200 is correspondingly electrically connected with a second set of contacts 50 of the another one of the second memory cells 200, and repeating this operation until multiple second memory cells 200 are sequentially stacked on the first memory cell 100, wherein the outer second memory cell 200 is a second memory cell 200 that is stacked on the first memory cell 100 and farthest away from the first memory cell 100 along the stacking direction.

It is to be noted that, in order to avoid the deformation of the second memory cells 200, a side of the memory array device 10 of each second memory cell 200 facing away from the CMOS device 20 may be bonded with a carrier 600, and therefore, removing the carrier 600 is required to be performed before bonding each second memory cell 200 with the other memory cells (the first memory cell 100 or another second memory cell 200). The carrier 600 bonded to the sides of the memory array devices 10 of the multiple second memory cells 200 may be the same carrier 600, that is, after a carrier 600 is removed from the memory array device 10 of one second memory cell 200, the carrier 600 is again bonded to the outer side of the memory array device 10 of a next second memory cell 200 to be stacked, and the carrier 600 is used repeatedly, which can decrease the number of the carriers 600 and reduce the cost. Of course, the outer side of the memory array device 10 of each second memory cell 200 may be bonded with a different carrier 600.

In some other examples of the present disclosure, through the above-mentioned operations, the first memory cell 100 and multiple second memory cells 200 may be stacked sequentially to constitute a three-dimensional memory device 1000*b* (as shown in FIG. 2); the number of memory cells of the three-dimensional memory device 1000*b* is more as compared with the three-dimensional memory device 1000; therefore, the three-dimensional memory device 1000*b* has a higher storage density, and it is also not necessary to stack too many memory layers 13 in the memory array device 10 of each memory cell of the three-dimensional memory device 1000*b*, thereby increasing the space utilization rate of the three-dimensional memory device 1000*b*.

In the examples of the present disclosure, in a fabrication process of the three-dimensional memory device, a method used for bonding between the memory array device 10 and its CMOS device 20 of the first memory cell 100, bonding between the memory array device 10 and its CMOS device 20 of the second memory cell 200, bonding between the memory array device 10 of the first memory cell 100 and the CMOS device 20 of the second memory cell 200, and bonding between the memory array device 10 of the second memory cell 200 and the CMOS device 20 of the other second memory cell 200 includes an Xtacking bonding process. The Xtacking bonding process refers to alignment bonding of bonding structures between different devices in the same process to achieve electrical connection of the two devices. The use of the Xtacking bonding process is favorable to select a more advanced manufacturing process to manufacture the memory array device and the CMOS device respectively, and reduce the complexity of a manufacturing procedure, so that the three-dimensional memory device obtains a higher I/O transmission speed, a higher density and a smaller volume.

The present disclosure further provides a three-dimensional memory that comprises any of the above-mentioned three-dimensional memory devices. The three-dimensional memory has the advantages of high storage density, high space utilization rate and the like of the above-mentioned three-dimensional memory devices and also has other structure features and functions of the above-mentioned three-dimensional memory devices, which is not repeated here.

One aspect of the present disclosure provides a three-dimensional memory device comprising at least two memory cells that are stacked sequentially, wherein the at least two memory cells include a first memory cell and at least one second memory cell stacked on the first memory cell, and each memory cell comprises: a memory array device and a CMOS device that are stacked and electrically connected with each other; and a first set of contacts disposed on a side of the memory array device facing away from the CMOS device, and electrically connected with the CMOS device; wherein the second memory cell further comprises a second set of contacts that is disposed on a side of the CMOS device of the second memory cell facing away from the memory array device of the second memory cell, and is electrically connected with the CMOS device of the second memory cell; the memory array device of the first memory cell is bonded with the CMOS device of an adjacent second memory cell, and the first set of contacts of the first memory cell is correspondingly electrically connected with the second set of contacts of the adjacent second memory cell; when there is one second memory cell, the second memory cell is an outer second memory cell stacked on the first memory cell, and the first set of contacts of the outer second memory cell is used to connect to an external device; when there are multiple second memory cells, the multiple second memory cells are sequentially stacked on the first memory cell; for two adjacent ones of the second memory cells, the first set of contacts of a second memory cell close to the first memory cell is correspondingly electrically connected with the second set of contacts of a second memory cell far away from the first memory cell; a second memory cell farthest away from the first memory cell along a stacking direction is defined as an outer second memory cell; and the first set of contacts of the outer second memory cell is used to connect to an external device.

Another aspect of the present disclosure further provides a manufacturing method of a three-dimensional memory device, which comprises: providing a first memory cell and a second memory cell each comprising a first set of contacts, and a memory array device and a CMOS device that are stacked and electrically connected with each other, wherein the first set of contacts is disposed on a side of the memory array device facing away from the CMOS device and electrically connected with the CMOS device; thinning a side of the CMOS device of the second memory cell facing away from the memory array device of the second memory cell; forming a second set of contacts on the side of the CMOS device of the second memory cell facing away from the memory array device of the second memory cell, wherein the second set of contacts is electrically connected with the CMOS device of the second memory cell; and stacking the second memory cell on a side of the memory array device of the first memory cell facing away from the CMOS device of the first memory cell, and bonding the memory array device of the first memory cell with the CMOS device of the second memory cell, so that the first set of contacts of the first memory cell is correspondingly electrically connected with the second set of contacts of the second memory cell.

Yet another aspect of the present disclosure further provides a three-dimensional memory comprising the above-mentioned three-dimensional memory device.

Although the examples of the present disclosure have been illustrated and described, those of ordinary skill in the art may understand that various changes, modifications, substitutions and variations may be made to these examples without departing from the principles and purposes of the present disclosure, and the scope of the present disclosure is defined by the claims and their equivalents.

What is claimed is:

1. A three-dimensional memory device, comprising at least two memory cells that are stacked sequentially, wherein the at least two memory cells include a first memory cell and at least one second memory cell stacked on the first memory cell, and a memory cell of the at least two memory cells comprises:

a memory array device;

a CMOS device stacked with and connected to the memory array device; and a first set of contacts disposed on a side of the memory array device facing away from the CMOS device and connected with the CMOS device, wherein the second memory cell further comprises a second set of contacts that is disposed on a side of the CMOS device of the second memory cell facing away from the memory array device of the second memory cell and is connected with the CMOS device of the second memory cell, wherein the memory array device of the first memory cell is bonded with the CMOS device of an adjacent second memory cell, and the first set of contacts of the first memory cell is correspondingly connected with the second set of contacts of the adjacent second memory cell, wherein, when there is one second memory cell, the second memory cell is an outer second memory cell stacked on the first memory cell, and the first set of contacts of the outer second memory cell is used to connect to an external device, and wherein, when there are multiple second memory cells, the multiple second memory cells are sequentially stacked on the first memory cell, and, for two adjacent ones of the second memory cells, the first set of contacts of a second memory cell close to the first memory cell is correspondingly connected with the second set of contacts of a second memory cell far away from the first memory cell, a second memory cell farthest away from the first memory cell along a stacking direction is defined as the outer second memory cell, and the first set of contacts of the outer second memory cell is used to connect to the external device.

2. The three-dimensional memory device of claim 1, further comprising an isolation layer and an array pad embedded in the isolation layer, wherein the isolation layer covers a side of the outer second memory cell facing away from the first memory cell and the first set of contacts of the outer second memory cell, and the array pad is correspondingly connected with the first set of contacts of the outer second memory cell and is used to connect to the external device.

3. The three-dimensional memory device of claim 2, further comprising a protective layer, wherein the protective layer covers a side of the isolation layer facing away from the outer second memory cell, and wherein the protective layer is provided with an opening in a position corresponding to the array pad, and the array pad is exposed through the opening to connect to the external device.

4. The three-dimensional memory device of claim 1, wherein the memory array device comprises an array substrate, and the first set of contacts of the memory cell of the at least two memory cells is disposed on a side of the array substrate of the memory array device facing away from the CMOS device, and wherein the CMOS device comprises a CMOS substrate, and the second set of contacts of the second memory cell is disposed on a side of the CMOS substrate of the second memory cell facing away from the memory array device of the second memory cell.

5. The three-dimensional memory device of claim 4, wherein the memory cell of the at least two memory cells further comprises an interconnection channel that is disposed in the memory array device and the CMOS device of the memory cell where the interconnection channel is located, and the interconnection channel is connected with the first set of contacts and the CMOS device of the memory cell where the interconnection channel is located, respectively, wherein the first set of contacts is connected to the CMOS device through the interconnection channel.

6. The three-dimensional memory device of claim 5, wherein the second memory cell further comprises conductive channels which penetrate through the CMOS substrate of the second memory cell and are connected with the second set of contacts and the CMOS device of the second memory cell respectively, wherein the second set of contacts is connected with the CMOS device of the second memory cell where the conductive channels are located through the conductive channels.

7. The three-dimensional memory device of claim 1, wherein the memory array device of the first memory cell and the memory array device of the second memory cell each include a preset number of layers of memory layers, and a value of the preset number of layers is an integer greater than 0 and less than 500.

8. A three-dimensional memory, comprising:

a three-dimensional memory device comprising at least two memory cells that are stacked sequentially, wherein the at least two memory cells include a first memory cell and at least one second memory cell stacked on the first memory cell, and a memory cell of the at least two memory cells comprises:

a memory array device and a CMOS device that are stacked and electrically connected with each other; and a first set of contacts disposed on a side of the memory array device facing away from the CMOS device and connected with the CMOS device, wherein the second memory cell further comprises a second set of contacts that is disposed on a side of the CMOS device of the second memory cell facing away from the memory array device of the second memory cell and is connected with the CMOS device of the second memory cell, wherein the memory array device of the first memory cell is bonded with the CMOS device of an adjacent second memory cell, and the first set of contacts of the first memory cell is correspondingly connected with the second set of contacts of the adjacent second memory cell, wherein, when there is one second memory cell, the second memory cell is an outer second memory cell stacked on the first memory cell, and the first set of contacts of the outer second memory cell is used to connect to an external device, and wherein, when there are multiple second memory cells, the multiple second memory cells are sequentially stacked on the first memory cell, and, for two adjacent ones of the second memory cells, the first set of contacts of a second memory cell close to the first memory cell is correspondingly connected with the second set of contacts of a second memory cell far away from the first memory cell, a second memory cell farthest away from the first memory cell along a stacking direction is defined as the outer second memory cell, and the first set of contacts of the outer second memory cell is used to connect to the external device.

* * * * *